United States Patent [19]

Kraska et al.

[11] Patent Number: 5,552,261

[45] Date of Patent: Sep. 3, 1996

[54] RECYCLING THE RECORDING LAYER OF FLEXOGRAPHIC PRINTING PLATES

[75] Inventors: Ursula A. Kraska, Weiterstadt; Udo Weikart, Obernburg; Reimund Simon, Bierstein, all of Germany

[73] Assignee: E. I. du Pont de Nemours and Company, Wilmington, Del.

[21] Appl. No.: 457,178

[22] Filed: Jun. 1, 1995

Related U.S. Application Data

[63] Continuation of Ser. No. 121,388, Sep. 14, 1993, abandoned.

[30] Foreign Application Priority Data

Sep. 25, 1992 [DE] Germany ............................ 42 32 188.3

[51] Int. Cl.[6] ........................................................ G03F 7/28
[52] U.S. Cl. ....................... 430/273.1; 430/329; 430/306; 430/271.1; 430/300
[58] Field of Search ..................................... 430/329, 306, 430/300, 271, 273, 273.1, 271.1

[56] References Cited

U.S. PATENT DOCUMENTS

| | | | |
|---|---|---|---|
| 3,654,021 | 4/1972 | Henkler et al. | 156/331 |
| 4,345,022 | 8/1982 | Kress | 430/329 |
| 4,720,448 | 1/1988 | Mousseau | 430/306 |
| 5,175,072 | 12/1992 | Martens | 430/306 |

FOREIGN PATENT DOCUMENTS

| | | | |
|---|---|---|---|
| 63-96660 | 4/1988 | Japan | 430/300 |

OTHER PUBLICATIONS

Mervinskii et al, 93:195436x, "Recycling photo polymer printing plate material based on oligoester acrylates." from *Poligr. Prom–St.*, Ref. Inf., 1979, vol. 12, pp. 25–31 (Russ). Chemical Abstract in English.

Anisimova et al, 86:91161t, "Waste–free technology for manufacturing photopolymeric printing forms" from *Poligrafiya*, 1976, vol. 9, pp. 22–24 (Russ). Chemical Abst. in English.

Henkler et al, 77:76250 from Chemical Abstracts File online, from US Patent 3,654,021.

RN 24993–04–2, Compound registered by Chemical Abstracts, American Chemical Society, Online informatin, 1995.

Kovalenko et al, CA 76:60558E, Abstract of "Photo polymeric printing forms based on polyamides", Tr., Vses, Nauch.–Issled. Inst. Kompleks. Probl. Poligr. (1970), vol. 20, No. 2, pp. 31–36.

Anisimova et al, CA 95:71071, "Multilayer photopolymerizable plate for manufacturing printing plates", from *Ukrainian Printing Institute, USSR; Scientific–Research Institute of Rubber and Latex Articles.* from: Otkrytiya, Izobret., Prom. Obraztsy, Tovarnye Znaki, 1981, vol. 16, p. 212. Chemical Abstract.

Patent & Trademark Office English Language Translation Of Japanese Patent 63-96660 (Pub. Apr. 27, 1988).

English–language translation of EPO–473 990 A2 & EPO–473 990 A3 published Mar. 11, 1992.

*Primary Examiner*—Cynthia Hamilton

[57] ABSTRACT

A process for recycling exposed and/or unexposed photopolymer flexographic printing plate containing a photopolymerizable recording layer and a support, said process comprising (a) separating the recording layer from the support and comminuting the material and (b) adding the material to a photopolymer mixture is described. The process reduces waste problems, is more environmentally friendly and is used to prepare photopolymerizable flexographic printing plates containing less raw materials.

5 Claims, 2 Drawing Sheets

RECYCLING THE RECORDING LAYER OF FLEXOGRAPHIC PRINTING PLATES

This is a continuation of application Ser. No. 08/121,388 filed Sep. 14, 1993, now abandoned.

FIELD OF THE INVENTION

The present invention concerns flexographic printing plates and more particularly, a process for making said plates using recycled unexposed and exposed photopolymer material and a process for recycling such material.

BACKGROUND OF THE INVENTION

Recycling waste materials, such as production rejects or finished products that are no longer needed, has assumed increasingly greater importance for environmental and cost reasons. Various processes have been proposed for recycling such waste materials, optionally after suitable treatment, for reuse in making similar or completely different products.

DE 40 26 786 describes a process for recycling granulated, used or waste, fiber-reinforced, cross-linked, thermosetting synthetic resins. EP 0 471 658 (U.S. Pat. No. 5,221,708) describes the use of recovered polyvinyl butyral (PVB) for making floor coverings.

In the printing industry, the use of photopolymer printing plates, especially flexographic printing plates, generates polymer waste.

Raw flexographic photopolymer plates comprise a recording layer, a support, and optionally a cover element. The recording layer is a photopolymerizable material, comprising an elastomeric binder, an unsaturated monomer, and an initiator. The chemical composition of single or multiple recording layers is described, for example, in DE 22 15 090 or EP 0 469 307 (U.S. Pat. No. 5,210,004). A transparent sheet, such as for example, a polyester sheet having a thickness of 0.1 mm to 0.2 mm, is used as a support. A flexible transparent polymeric sheet is used as a cover element.

To transfer image information onto the raw plate, the recording layer is exposed to actinic light through a negative in an exposure apparatus. Polymerization changes the physical properties of the exposed areas of the recording layer. Exposed areas are insoluble in a washoff solvent, whereas unexposed areas are dissolved by the solvent and removed in the washoff process, yielding a relief image. Thus, the raw plate has been converted to a photopolymer printing form or for short, a printing form.

Photopolymer materials that are considered waste by one skilled in the art, are unexposed material that are leftover from the manufacture of photopolymerizable raw plates. Such wastes would include for example, (a) edge strips, (b) losses from starting and stopping production, and (c) unusable, out-of-date raw plates. Large quantities of waste from exposed printing plates accumulate in printing plants as plates that are no longer needed. Such wastes are currently either burned or following exposure to ultraviolet radiation, are deposited in waste dumps.

It is becoming clear, especially in the disposal of raw plate wastes, that this problem is not being handled satisfactorily. Unused, valuable material containing mostly unexposed photopolymer is disposed of by expensive and environmentally unfriendly processes.

Therefore, a problem addressed in the present invention is the formulation of a process for recycling the unexposed photopolymerizable and the exposed photopolymerized components of flexographic printing plates. Another problem addressed in the present invention is the formulation of photopolymer flexographic printing plates and processes for their production, which (a) reduce waste problems, (b) place a smaller burden on the environment, and (c) require less raw materials.

These problems are solved by the present invention.

SUMMARY OF THE INVENTION

The present invention describes a process for separating the exposed or unexposed recording layer from the support of a flexographic printing plate, optionally comminuting the layer, and adding it to the manufacturing process for synthetic resin mixtures. Specifically, the present invention describes a process for recycling the photopolymerizable recording layer material from an exposed or unexposed flexographic printing plate comprising:

(a) providing a flexographic printing plate having a support and a photopolymerizable recording layer provided thereon;

(b) separating the recording layer from the support;

(c) optionally comminuting the layer; and (d) adding the comminute proportionately to a synthetic resin mixture to make an appropriate synthetic resin.

DETAILED DESCRIPTION OF THE INVENTION

Figure 1:
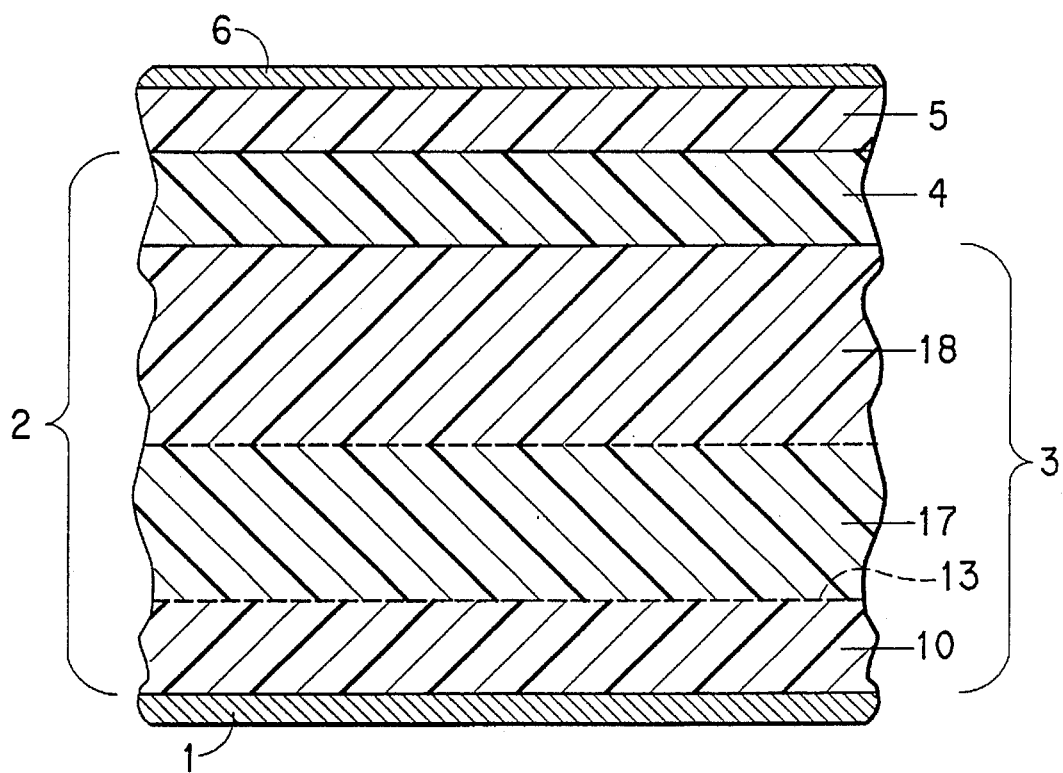
FIG. 1 illustrates a schematic view of a cross-section of a multilayer raw plate. A raw photopolymer plate (7) comprising a support (1), a protective coversheet (6), a photopolymerizable recording layer (3), a printing layer (4), and a release layer (5) is shown. The photo-polymerizable layer (3) comprises a first photosensitive photopolymer layer (17) and a second photosensitive photopolymer layer (18). A raw plate can also comprise several such photosensitive photopolymer layers. The printing layer (4) is also a photosensitive photopolymer layer. It serves to improve ink transfer in printing. The choice of a specific photopolymer composition for this layer determines the suitability of the printing plate for various printing stocks. The release layer (5) prevents adhesion to the film negative on imagewise exposure. It also enables easy removal of the protective coversheet (6). A thin layer (10) of the photopolymerizable recording layer (3) is polymerized by backside exposure and adheres firmly to the support (1). The interface (13) separates the polymerized and unpolymerized areas of the recording layer (3). The unexposed printing plate material (2) is used in recycling raw plate wastes to make new raw photopolymer plates. If the release layer (5) is a problem in recycling, it can be removed by a suitable solvent after the protective sheet is stripped off.
Figure 2:
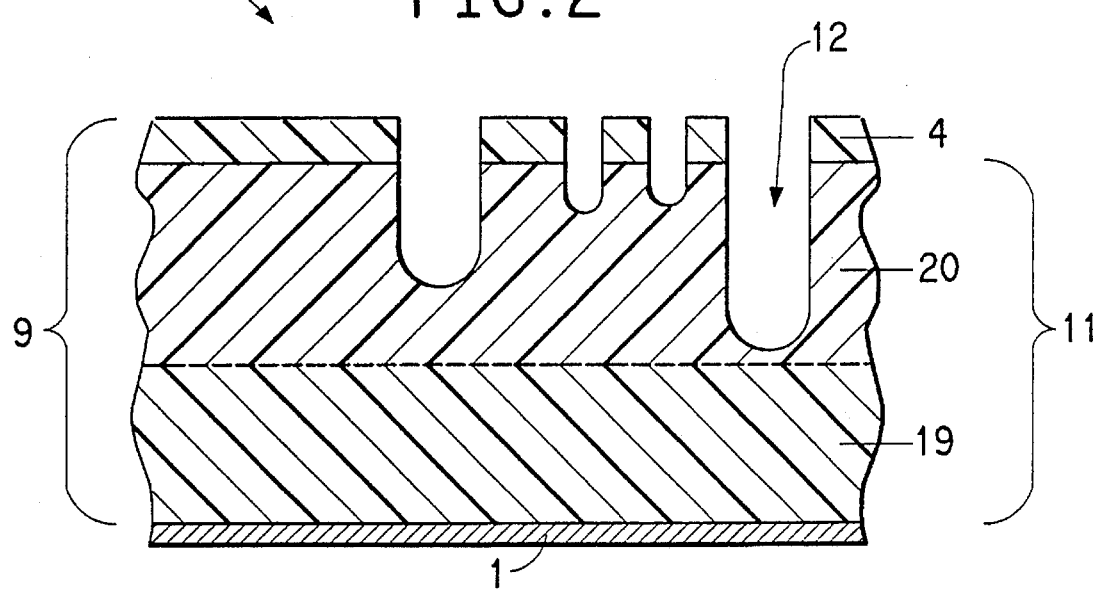
FIG. 2 illustrates a schematic view of a cross section of a multilayer printing plate. A photopolymer printing plate (8) that has been imagewise exposed and developed is shown. The plate is prepared from a raw plate by (a) removal of the protective sheet, (b) exposure of the raw plate through a negative, and (c) development with a washoff solvent. Washoff yields a printing relief (12) corresponding to the image information in the negative of the original. Washoff also removes the release layer (5). The printing layer (4) transfers the ink onto the printing stock. The photopolymerized recording layer (11) remains elastomeric after the plate is washed off and dried. The photopolymerized recording layer (11) comprises a first polymerized recording layer (19) and a second polymerized recording layer (20). A printing plate can contain several such layers. In recycling printing plate wastes, exposed printing plate material (9) is separated from the support (1) and used to make a raw photopolymer plate.
Figure 3:
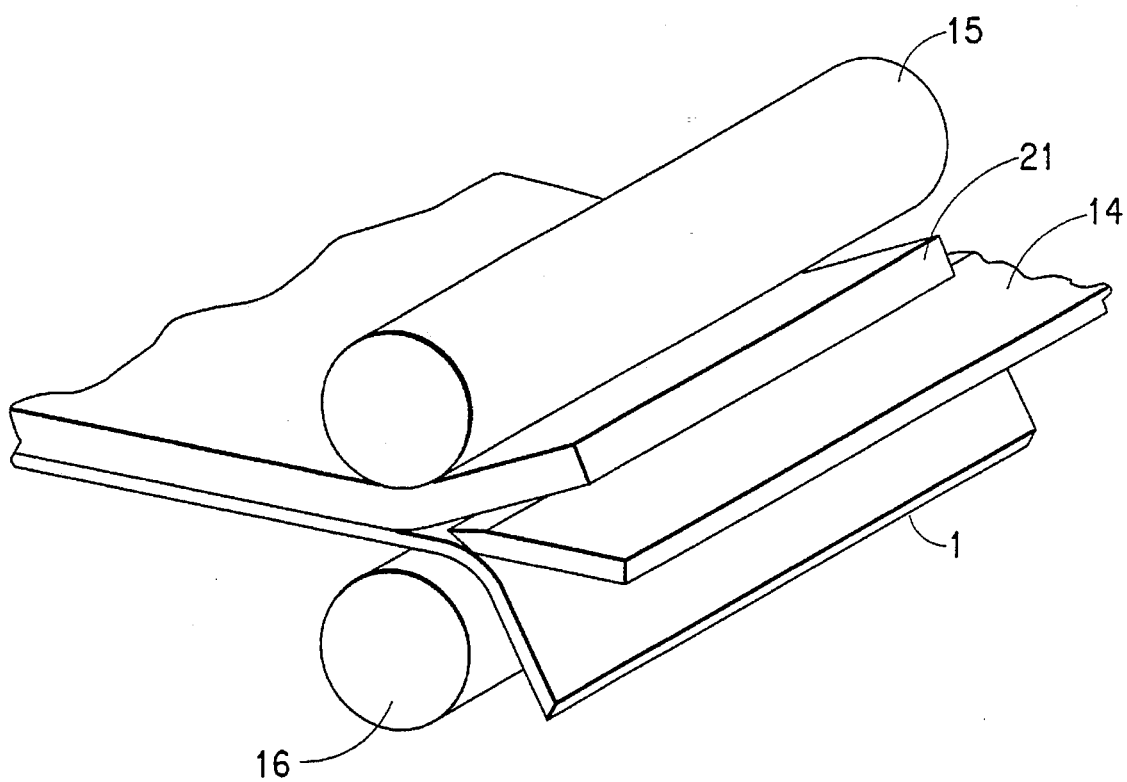
FIG. 3 illustrates a schematic view of the splitting step, in a three dimensional perspective. A schematic view of the separation step by the band knife (14) of a band knife splitting machine is shown. Such machines are known in the art and are not further described herein. The plate to be split will be either a raw photopolymer plate or a photopolymer printing plate that has been exposed and developed. In either case, the plate is fed to the band knife (14) at the correct height, into the pressure nip between an upper feed roller (15) and a lower feed roller (16). The support (1) is separated from the unexposed or exposed printing plate material 21.

The invention concerns a process for recycling unexposed and exposed photopolymer flexographic printing plates. The invention further concerns a process for making a photopolymer flexographic printing plate containing a photosensitive recording layer composed at least partially of recovered or recycled photopolymer material.

Recycling unexposed and exposed photopolymer has proven to be more difficult because photopolymer flexographic printing plates are synthetic resin composites. Thus, before the photopolymer can be recycled, the bonding of the individual synthetic resins must first be dissolved. Although the coversheet on the raw, unexposed plate can be removed easily by hand, the polyester support sheet remains firmly bonded to the photopolymerizable recording layer.

Mechanical and thermal processes for separating bonded resins are known in the art. For example, EP 0 236 730 (U.S. Pat. No. 4,888,080) describes a delaminating machine. DE 26 36 805 (U.S. Pat. No. 4,025,990) discloses a separation process in which rubber components for reuse can be obtained from used tires by cooling to the embrittlement temperature.

A band knife splitter has proven to be particularly useful in conducting the separation process on photopolymer flexographic printing plates. The machine is suitable for cleanly splitting the photopolymer away from the polyester support sheet in raw plate and printing plate wastes. In addition to the synthetic resin sheets, the residues are exposed photopolymer from printing plate wastes and unexposed photopolymer from raw plate wastes. The split is made preferably along the interface of the photopolymerizable recording layer next to the support.

After the exposed or unexposed photopolymer is separated from the support, it is then put into a form suitable for further processing, mostly by comminuting the photopolymer according to the methods given below. The resulting material can now be added to various polymeric mixtures in different proportions. Typical proportions are between 10% and 50%, depending on the compatibility of the polymers and the desired physical properties.

Photopolymer wastes obtained from unexposed raw plates and exposed printing forms are particularly preferred for making photopolymer flexographic printing plates. For this purpose, the photopolymerizable recording layer is separated from the support by the above-described method. After separation, the recording layer is preferably first comminuted.

Comminuting exposed photopolymer can be accomplished in (a) an impact mill, (b) a pinned disk mill, or (c) by special extrusion methods. The material is processed in the grinding chamber of these devices until the desired particle size is attained.

The method is similar for unexposed raw plate wastes. After the unexposed photopolymer is separated from the support sheet, it is comminuted in a granulator. A typical particle size is about 6 mm. Clumping is reduced by adding an antitack agent, preferably pyrogenic silica. The use of granulated, exposed, recovered printing plate material is particularly preferred. The antitack agent is usually added during the comminution step. This enables intermediate storage of the granulate without clumping for several weeks in a lightproof container. Then the granulate can be coordinated with the product composition to be used at a certain production time and mixed with fresh raw material into the manufacturing process for flexographic printing plates. This process comprises mixing and heating the components in a screw extruder, degassing the melt, extruding it through a wide slot nozzle into the nip of a calendar, forwarding the calendared material onto a support, and anchoring it on the support by actinic exposure through the support. Such a process is disclosed, for example, in EP 00 80 665.

Surprisingly and unexpectedly it was found that it is possible to make raw photopolymer plates with photopolymerizable recording layers comprising material recovered from unexposed raw plate wastes. One skilled in the art of flexographic printing would have expected that the heat-sensitive components of the raw plates, i.e., the monomers and initiators, would not have withstood the recycling process unchanged, and therefore, the sensitometric properties of the printing plate would be degraded. It was shown, however, that the quality of these recycled printing plates is completely satisfactory, even with a high proportion of recovered material. Moreover, it was found that a raw plate made exclusively of production wastes can yield very good printing results.

It was also a completely unexpected finding that exposed, finely divided photopolymer recovered from printing form wastes and added to the photopolymerizable composition produced useful printing plates. This result was not expected because the added material is not photosensitive.

Good quality printing plates were made even by adding recovered, exposed photopolymer at 40% by weight relative to the weight of the raw printing plate. The photopolymerizable flexographic printing plate which comprises at least one photopolymerizable recording layer, a dimensionally stable support, and optionally a protective sheet wherein the photopolymerizable recording layer contains recovered exposed phot polymer material and wherein said photopolymerizable recording layer contains up to 60% recovered exposed photopolymer material. A larger proportion of recovered exposed material can be used to prepare multilayer flexographic printing plates, if the material is added to the lower polymeric layers next to the support. These layers impart to the printing relief, the elastomeric properties characteristic of flexographic printing plates. An elastomeric relief base can even be achieved at relatively high additions of 60% to 80%.

There are several possible usages for photopolymer waste. One possible use for photopolymer waste is, for example, as a filler. Fillers can reduce the cost of a secondary product and can modify properties in a controlled manner.

Such waste additions are outstandingly suitable for products that must be mass-produced at low cost. Examples of these products include sound absorbing walls, pallets, coverings, packing materials, and insulating materials.

Exposed photopolymer material obtained from flexographic printing plates can also be used to make polypropylene-rubber mixtures. As shown in Table 1 below, important properties of such a mixture, in this instance, break elongation and tear propagation resistance, can be improved while retaining other properties.

The invention is illustrated further in the following examples.

EXAMPLES

Example 1

Mixtures comprising 80% polypropylene/styrene/butadiene elastomer and 20% recovered printing plate material were prepared and processed in a screw mixer at 35 rpm for eight minutes at 120° C. Sample test plates were made from the resulting homogeneous material in a press at 300 bar pressure for 15 minutes. Table 1 indicates the physical property data for these samples compared with the data for the starting material.

photopolymer per hour. About 1% pyrogenic silica was added during the comminution. The appropriate granule size was separated through a 6 mm mesh sieve. The granules were transferred onto a second conveyor belt to a filling station for loading into lightproof containers. After several weeks storage, the granules were added to a photopolymerizable composition for raw plates, and raw plates were produced. This recycling process can be used on a manufacturing scale.

A comparison of the characteristic parameters of these raw photopolymer plates containing 0%, 20%, and 30% recycled material, relative to the weight of the raw plate is provided in Table 2 below.

The following describes the test parameters: Exposure latitude is the time interval between the maximum and minimum exposure time to obtain a specific test printing relief. Maximum exposure time is that exposure time for which the negative lines can just barely be washed off in a standard washoff process. Minimum exposure time is that time for which the positive dots, especially the 2% dots, can just barely not be washed away in a standard washoff process. In practice, this means that the greater the exposure latitude, the less critical is the process of making the printing relief. As Table 2 shows, exposure latitude does indeed decrease with increasing content of recycled material, but

TABLE 1

| Parameter | Hardness (Shore A) | Tensile Strength (MPa) | Break Elongation (%) | Tear Propagation Resistance (N/mm) | |
|---|---|---|---|---|---|
| | | | | Longitudinally | Transversely |
| Standard | 94 | 7.2 | 38 | 11.6 | 11.9 |
| 20% Recycled Material | 93 | 6.0 | 97 | 15.7 | 15.2 |

Both semi-finished and finished products can be made from the material thus obtained.

Example 2

The following example compares physical and commercial printing parameters of recycled printing plates. Unexposed polymer was reclaimed from production wastes and used to make raw photopolymer plates. This derivative raw material replaced the original primary raw material in various proportions.

experience has shown that any value over 15 minutes is still considered to be good.

The Shore A hardness and elasticity are almost unchanged. Surface tension is a parameter that describes ink transfer properties. As shown in Table 2, surface tension was not changed. The change in flexibility is within measurement reliability. It is measured in angle degrees of an overhanging printing plate.

TABLE 2

| % Recycled Material | Backside Exposure (sec) | Main Exposure (min) | | Exposure Latitude (min) | Hardness (Shore A) | | Flexibility (degrees) | Elasticity (%) | Surface Tension (dynes/cm) |
|---|---|---|---|---|---|---|---|---|---|
| | | Line Sample | Halftone Sample | | Unpolymerized | Polymerized | | | |
| 0 | 43 | 3 | 6 | 20 | 27.7 | 51.0 | 39 | 53 | 31 |
| 20 | 47 | 3 | 8 | 18 | 27.5 | 51.3 | 39 | 53 | 31 |
| 30 | 50 | 3 | 9 | 17 | 27.5 | 51.2 | 38 | 53 | 31 |

After the cover sheet was removed manually, the support was split away from the production wastes with a Type G 1 band knife splitting machine from Firma Fecken-Kirfel. The unexposed photopolymer was transferred on a conveyor belt into the inlet of a Type CS 300/600-II cutting mill from Firma Condux, capable of comminuting 200 to 250 kg of The data in Table 2 shows that for raw plates made with 20% and 30% recycled material there is little difference from data for raw plates made with standard materials. The deviations are mostly within measurement reliability. DuPont's Type PLS photopolymer was used to make each plate.

EXAMPLE 3

This example demonstrates the printing behavior of recycled printing plates. Polyethylene film, lined paper, and unlined paper were used as printing stocks. Solvent inks and aqueous inks were tested as printing inks. Here too, the characteristic parameters of printing plates of standard and recycled material were compared and the results are presented in Table 3 in tabular form. The photopolymerizable recording layer of the recycled printing plates contained unexposed photopolymer (DuPont's Type TDR) recovered from production wastes.

TABLE 3

| Parameter | Backside Exposure (sec) | Main Exposure (min) | | Exposure Latitude (min) | Hardness (Shore A) | | Flexibility (degrees) | Elasticity (%) | Surface Tension (dynes/cm) |
|---|---|---|---|---|---|---|---|---|---|
| | | Line Sample | Halftone Sample | | Unpolymerized | Polymerized | | | |
| Standard | 40 | 4 | 6 | 25 | 17.0 | 36.8 | 56 | 52.4 | 36 |
| 100% Recycled | 60 | 4 | 6 | 20 | 17.0 | 39.2 | 56 | 52.4 | 36 |

The test results show in Table 3 that recycled plates yield printing comparable to that with standard material plates at comparably higher printing feed on polyethylene film and on paper. Table 3 shows that the relevant data for printing plates made exclusively of production wastes differ insignificantly from that for printing plates made of standard material.

EXAMPLE 4

Long-run tests were conducted on a printing machine to investigate the aging behavior of recycled printing plates. Table 4 compares plates of standard material and plates of recycled material. Mechanical parameters such as printing plate thickness and Shore A hardness before and after printing were measured. DuPont's Type TDR photopolymer was used. The photopolymer layer of the raw recycled plate contained 100% unexposed material recovered from production wastes. The results are provided in Table 4 below.

TABLE 4

| Parameter | Thickness Before Printing | Thickness After Printing | Shore A Hardness Before Printing | Shore A Hardness After Printing |
|---|---|---|---|---|
| Standard | 2.825 mm | 2.822 mm | 37 | 35 |
| 100% Recycled | 2.722 mm | 2.719 mm | 39 | 40 |

As Table 4 shows, recycled printing plates do not differ from standard material printing plates after an average service life.

What is claimed is:

1. A raw flexographic printing plate comprising at least one photopolymerizable recording layer, a dimensionally stable support, and optionally a protective sheet, wherein the photopolymerizable recording layer contains recovered photopolymer material which comprises exposed solid photopolymerized material which has been exposed to actinic radiation and a synthetic resin mixture or solid unexposed photopolymerizable material which has not been exposed to actinic radiation or both wherein said recovered photopolymer material is derived from recycled flexographic printing plates or from recovered raw printing plates or both and wherein the photopolymerizable recording layer comprises an elastomeric binder; an unsaturated monomer and an initiator.

2. The raw flexographic printing plate of claim 1, wherein the recovered photopolymer material in the photopolymerizable recording layer is the unexposed photopolymerizable material derived from a recovered raw printing plate.

3. The raw flexographic printing plate of claim 1, wherein the recovered photopolymer material in the photopolymerizable recording layer is the exposed photopolymerized material derived from a recycled flexographic printing plate.

4. The raw flexographic printing plate of claim 3, wherein the photopolymerizable recording layer contains up to 60% by weight of the exposed photopolymerized material derived from a recycled flexographic printing plate relative to the weight of the raw plate.

5. The raw flexographic printing plate of claim 1, comprising multiple photopolymerizable recording layers wherein, when the exposed solid photopolymerized material is added to the lower polymeric layers next to the dimensionally stable support, said exposed solid photopolymerized material may comprise 60–80% weight percent of the multiple photopolymerizable recording layer relative to the weight of the raw plate.

\* \* \* \* \*